(12) United States Patent
Becker et al.

(10) Patent No.: US 6,529,355 B1
(45) Date of Patent: Mar. 4, 2003

(54) INPUT PROTECTION CIRCUIT IMPLEMENTING A VOLTAGE LIMITER

(75) Inventors: Al Becker, Austin, TX (US); Bakul Damle, Round Rock, TX (US)

(73) Assignee: National Instruments Corporation, Austin, TX (US)

( * ) Notice: Subject to any disclaimer, the term of this patent is extended or adjusted under 35 U.S.C. 154(b) by 282 days.

(21) Appl. No.: 09/605,139

(22) Filed: Jun. 27, 2000

(51) Int. Cl.[7] .............................. H02H 9/00; H02H 3/00; H02H 7/00; H02H 9/02

(52) U.S. Cl. ........................................ 361/56; 361/101

(58) Field of Search ................................ 361/101, 93.9, 361/18, 57, 56

(56) References Cited

U.S. PATENT DOCUMENTS

| | | | |
|---|---|---|---|
| 4,562,454 A | * 12/1985 | Schultz et al. ............... 357/51 |
| 4,659,942 A | * 4/1987 | Volp ............................ 307/19 |
| 4,706,159 A | * 11/1987 | Hafner ........................ 361/93 |
| 5,159,516 A | * 10/1992 | Fujihira ...................... 361/18 |
| 5,654,859 A | * 8/1997 | Shi .............................. 361/66 |
| 5,684,663 A | * 11/1997 | Mitter ......................... 361/106 |
| 5,734,261 A | 3/1998 | Knudsen | |
| 5,804,859 A | * 9/1998 | Takahashi et al. .......... 257/355 |
| 5,847,538 A | * 12/1998 | Yoshimatsu .................. 320/5 |
| 6,078,488 A | * 6/2000 | Gunion ........................ 361/58 |
| 6,141,195 A | * 10/2000 | Buhring et al. .............. 361/67 |

* cited by examiner

*Primary Examiner*—Brian Sircus
*Assistant Examiner*—Z Kitov
(74) *Attorney, Agent, or Firm*—Jeffrey C. Hood (57) ABSTRACT

A circuit that protects a current shunt or any analog measuring circuit without the implementation of fuses. In a particular embodiment, a circuit comprises a current shunt and a plurality of transistors that may be configured to function as a fuse. One of the transistors may be deactivated once the input voltage exceeds a negative threshold voltage. The other transistor may be deactivated once the input voltage exceeds a positive threshold voltage. By deactivating the transistors once the input voltage exceeds a negative or a positive threshold voltage, the transistors are configured to function as a fuse and provide input protection for a current shunt or for any analog measuring circuit. In another particular embodiment, a circuit provides protection for a first and second current shunt where the second current shunt is less in resistance than the first current shunt. The circuit further comprises a plurality of transistors that may be configured to function as a fuse. The circuit further comprises a current limiter to protect the second current shunt at a second range and a voltage limiter to protect the current limiter at a first range, where the second range is smaller than the first range. The voltage limiter operates to deactivate the transistors once the input voltage exceeds a negative or positive voltage threshold of the first range. The current limiter operates to limit the current flowing through the transistors once the input voltage exceeds a negative or positive voltage threshold of the second range.

36 Claims, 3 Drawing Sheets

INPUT PROTECTION CIRCUIT IMPLEMENTING A VOLTAGE LIMITER

FIELD OF THE INVENTION

The present invention relates to the field of test and measurement systems, and more particularly to an input protection circuit for a current shunt or for any analog measuring circuit including an overload monitoring scheme.

DESCRIPTION OF THE RELATED ART

Scientists and engineers often use test and measurement and data acquisition systems to perform a variety of functions, including laboratory research, process monitoring and control, data logging, analytical chemistry, test and analysis of physical phenomena and control of mechanical or electrical machinery, to name a few examples. One example of hardware to implement such measuring systems is a computer-based measurement system or data acquisition (DAQ) system. A computer-based measurement or DAQ system typically includes transducers for measuring and providing electrical signals, signal conditioning hardware which may perform amplification, isolation and/or filtering, and measurement or DAQ hardware for receiving digital and analog signals and providing them to a processing system, such as a personal computer. The computer may further include analysis hardware and software for analyzing and appropriately displaying the measured data.

As mentioned above, a measurement system may include one or more of a measurement or DAQ device comprised in or connected to a computer system. The device may be an I/O board plugged into one of the I/O slots of the processing or computer system. The measurement or DAQ device may also comprise an external device connected to a computer system. Exemplary hardware I/O (input/output) interface include the GPIB (general purpose interface bus), the VXI bus, the PXI bus, or a serial bus such as the RS-232 protocol, IEEE 1394, or USB.

Measurement systems typically include circuits that are designed to protect the measurement system from analog voltage spikes, high voltages, and other harmful signals. Many such circuits comprise a fuse which protects the system from an excess amount of current. For example, a fuse may blow when the current rating of the fuse wiring is exceeded. However, fuses may be inconvenient or difficult to replace, such as on a board that is inside a computer. Hence a disadvantage of fuses relates to their inconvenience and/or impracticability in circuit boards in computers.

Furthermore, many measurement systems comprise current shunts which are used to measure current. A current shunt is a resistor in series with the load that is able to measure the current to the load. Current shunts may be protected by fuses; however, there exists the same disadvantage of being inconvenient or difficult to replace on a circuit board inside a computer.

Measurement systems may instead include a pair of transistors, such as MOSFETs, with a resistor in series between them. The MOSFETs and resistor act to protect the measurement system from an excess amount of current. The transistors are activated unless a voltage is applied to deactivate them. If there is no current flowing, then there is no voltage across the resistor and hence no voltage across the gates of the transistors. As current starts to flow through, voltage builds up across the resistor which then starts to deplete one or the other of the transistors. The circuit does not deactivate rapidly but instead forms a current source. The current source is determined by the resistor and threshold voltages of the transistors. The circuit is good for high frequency voltage inputs but the resistance is too high for current shunts. Another disadvantage is that the constant current source leads to excess power dissipation.

It would therefore be desirable to develop a circuit that provides input protection for a current shunt or for any analog measuring circuit including an overload monitoring scheme that does not implement fuses.

SUMMARY OF THE INVENTION

One embodiment of the invention comprises a circuit that provides input protection for a current shunt or for an analog measuring circuit which includes an overload monitoring scheme.

A measurement system may be configured to include an input protection circuit that protects a current shunt or any analog measuring circuit without the implementation of fuses. A plurality of transistors may be used to function in a similar manner to a fuse.

A particular embodiment of the input protection circuit may comprise the following: an input, a first transistor coupled to the input, a second transistor in series with the first transistor, a first detection circuitry coupled to the first transistor, a second detection circuitry coupled to the second transistor, and a current shunt in series with the second transistor. If the input exceeds a negative voltage threshold, then the first detection circuitry deactivates the first transistor. If the input exceeds a positive voltage threshold, then the second detection circuitry deactivates the second transistor.

Thus, one of the transistors may be deactivated once the input voltage exceeds a negative threshold voltage. The other transistor may be deactivated once the input voltage exceeds a positive threshold voltage. By deactivating the transistors once the input voltage exceeds a negative or a positive threshold voltage, the transistors function in a similar manner to a fuse and provide input protection for a current shunt or for any analog measuring circuit.

Another particular embodiment comprises a circuit providing protection for a first and a second current shunt, where the second current shunt is less in resistance than the first current shunt. The circuit comprises the following: an input, a first transistor coupled to the input, a second transistor in series with the first transistor and coupled to a switch to determine which current shunt is connected to the circuit, a voltage limiter coupled to the first and second transistor and to the input where the voltage limiter operates to selectively deactivate one of the first transistor or the second transistor if the input signal exceeds a first range, and a current limiter coupled to the first and second transistor and to the plurality of current shunts where the current limiter operates to selectively deactivate one of the first transistor or the second transistor if the input signal exceeds a second range. The second range is smaller than the first range.

If the input exceeds a negative voltage threshold of the first range, then the voltage limiter deactivates the first transistor. If the input exceeds a positive voltage threshold of the first range, then the voltage limiter deactivates the second transistor. If the input exceeds a negative voltage threshold of the second range, then the current limiter limits the current flowing through the first transistor. If the input exceeds a positive voltage threshold of the second range, then the current limiter limits the current flowing through the second transistor. Thus, the current limiter operates to protect the second current shunt and the voltage limiter operates to protect the current limiter.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

One embodiment of the present invention comprises an input protection circuit that provides input protection for a current shunt or for any analog measuring circuit which includes an overload monitoring scheme. The input protection circuit utilizes one or more transistors to essentially emulate a fuse.

Figure 1:
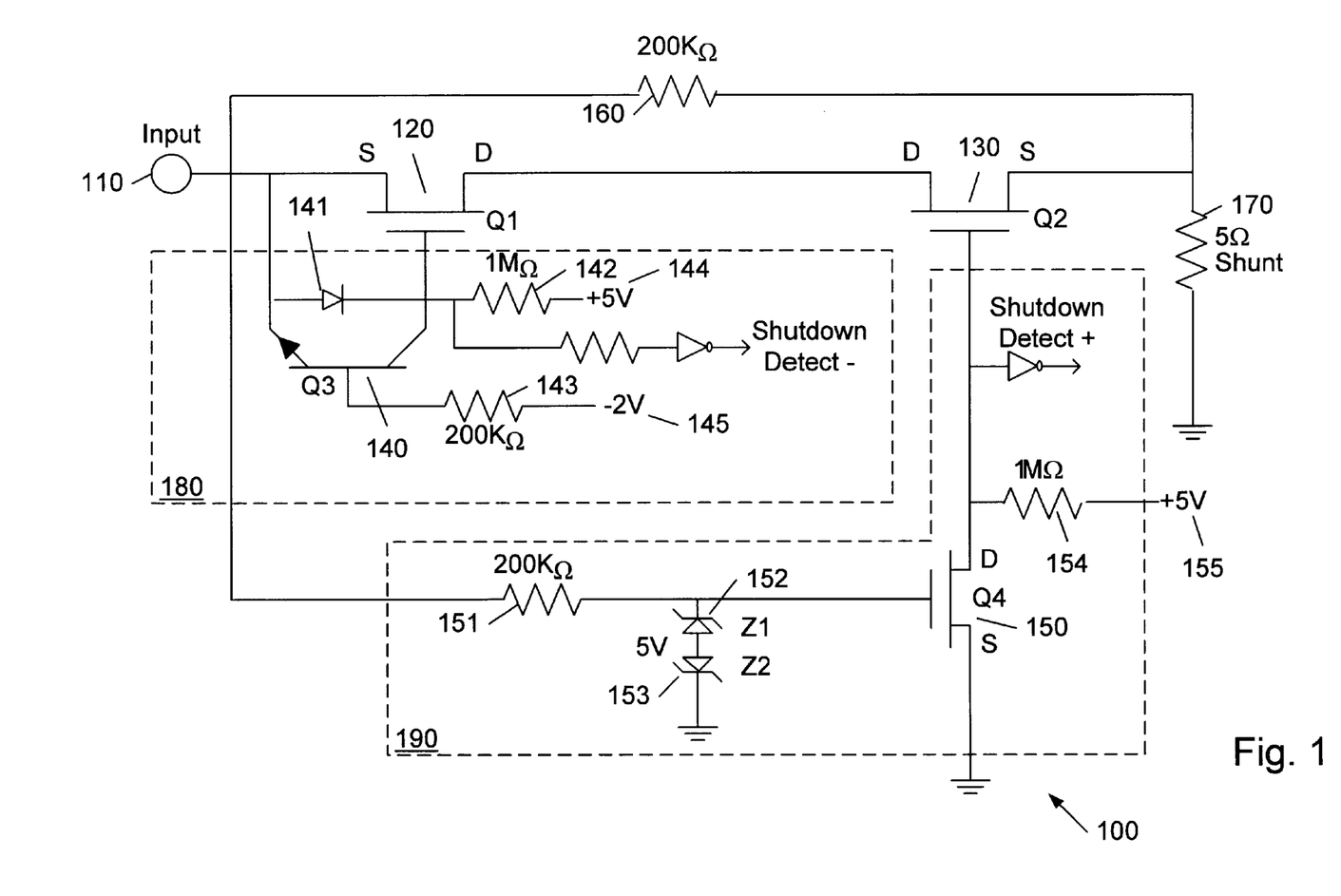
FIG. 1 illustrates an input protection device according to an embodiment of the present invention.

FIG. 1—Input Protection Circuit

FIG. 1 illustrates an input protection circuit 100 according to an embodiment of the present invention. It is noted that the values of the circuitry elements such as resistors, voltage sources and current shunts, may exhibit different values than the values illustrated in FIG. 1.

Circuit 100 comprises an input 110 coupled to a first transistor 120. The input 110 is further coupled to a resistor 160 with a value of 200 KΩ which is coupled to a current shunt 170. Resistor 160 is provided to discharge any capacitive charge on the input 110 to ensure that circuit 100 can reset itself to normal operation. The first transistor 120 is further coupled to a second transistor 130. The second transistor 130 is coupled to current shunt 170. Current shunt 170 may have a resistance of 5Ω. Transistors 120 and 130 may be a MOSFET enhancement type transistor or a bipolar transistor. Transistors 120 and 130 are configured to function in a similar manner to a fuse to protect the current shunt 170.

First transistor 120 is coupled to a first detection circuitry 180. As illustrated in FIG. 1, transistor 120 is an N-channel MOSFET. It is noted that transistor 120 may be other types of transistors such a P-channel MOSFET. FIG. 1 illustrates one embodiment of the first detection circuitry 180, it being noted that the first detection circuitry 180 may be implemented in various ways. The first detection circuitry 180 in FIG. 1 detects when the input voltage 110 exceeds a negative voltage threshold. When the input voltage 110 exceeds the negative voltage threshold, the first detection circuitry 180 deactivates the first transistor 120. It is important to note that the first detection circuitry 180 may be designed to turn off transistor 120 when the input voltage 110 exceeds a positive voltage threshold instead of exceeding a negative voltage threshold. That would occur when transistors 120 and 130 were P-channel MOSFETs or when the drains and sources of transistors 120 and 130 are reversed.

The first detection circuitry 180 comprises a third transistor 140, an NPN bipolar junction transistor, coupled to a diode 141, as shown. Transistor 140 includes an emitter coupled to a source of transistor 120 and a collector coupled to a gate of transistor 120. Diode 141 includes an anode connected to the source of transistor 120 and a cathode connected to the gate of transistor 120. Diode 141 is coupled between the source and gate of transistor 120 to protect the gate of transistor 120 from excess voltage damage. The cathode of diode 141 is further connected to resistor 142.

Resistor 142 with a value of 1 MΩ is coupled between the gate of transistor 120 and a voltage source 144 of +5 volts. The +5 voltage source 144 provides enhancement voltage to the gate of transistor 120 which turns on transistor 120 during normal operations. It is noted that the voltage source may be as high as +10 volts or more if needed for any specific MOSFET type. The purpose of the voltage source is to ensure that the gate of transistor 120 is more positive than the source of transistor 120 and hence turn on transistor 120 during normal operation. Resistor 143 with a value of 200 KΩ is coupled between the base of the third transistor 140 and a voltage source of −2 volts 145. Values of resistors 142, 143 will vary depending upon the value of the negative cut-off voltage, i.e. negative voltage threshold, of circuit 100.

The first detection circuitry 180 deactivates the first transistor 120 when the input voltage 110 becomes lower than the negative voltage threshold of the first transistor 120 by having the third transistor 140 deactivate transistor 120. In order to turn off transistor 120, the gate voltage of transistor 120 must approximately equal the source voltage of transistor 120. The source voltage of transistor 120 is approximately equal to input voltage 110. Hence, transistor 140 turns off transistor 120 by shorting out both the gate and source of transistor 120. Transistor 140 is turned on only when the base is forward biased. That is, when the input voltage 110 is less than −2.7 volts, transistor 140 will turn on allowing current to flow from the input 110 to the −2 voltage supply 146 through resistor 143. The input voltage 110 must be less than −2.7 volts because the source voltage 145 is −2 volts and the base junction voltage of transistor 140 is 0.7 volts. It is noted that the value of the −2 voltage source 145 will vary depending upon the value of the negative cut-off voltage of circuit 100. That is, the second voltage source 145 determines the value of the voltage threshold. It is further noted that the voltage of the input 110 to turn on transistor 140 will vary because the voltage source 145 may vary. When transistor 140 is turned on, transistor 140 deactivates transistor 120 by forcing the gate of transistor 120 to approximately equal the source of transistor 120.

The second transistor 130 is coupled to a second detection circuitry 190. As illustrated in FIG. 1, transistor 130 is an N-channel MOSFET. It is noted that transistor 130 may be other types of transistors such a P-channel MOSFET. FIG. 1 illustrates one embodiment of the second detection circuitry 190, it being noted that the second detection circuitry 190 may be implemented in various ways. The second detection circuitry 190 in FIG. 1 detects when the input voltage 110 exceeds a positive voltage threshold. When the input voltage 110 exceeds the positive voltage threshold, the second detection circuitry 190 deactivates the second transistor 130. It is important to note that the second detection circuitry 190 may be designed to turn off transistor 130 when the input voltage 110 exceeds a negative voltage threshold instead of exceeding a positive voltage threshold. That would occur when transistors 120 and 130 were P-channel MOSFETs or when the drains and sources of transistors 120 and 130 are reversed.

The second detection circuitry 190 comprises a fourth transistor 150. The gate of the fourth transistor 150 is coupled in parallel to a plurality of zener diodes 152, 153. Zener diodes, 152 and 153, provide clamping to prevent excess voltage at the gate of transistor 150. Excess voltage at the gate of transistor 150 may cause damage to transistor 150. Furthermore, the gate of the fourth transistor 150 is coupled to a resistor 151 with a 200 KΩ resistance. Resistor 151 is further coupled to input 110. Resistor 154 with a 1

MΩ resistance is coupled between the drain of the fourth transistor 150 and a voltage source 155 of +5 volts.

The second detection circuit 190 deactivates transistor 130 when the input voltage 110 exceeds the positive voltage threshold by having transistor 150 being turned on which shorts the gate voltage of transistor 130. In the second detection circuit 190 of FIG. 1, a +5 voltage source 155 is coupled to resistor 154 to provide enhancement voltage to the gate of transistor 130. It is noted that the voltage source may be as high as +10 volts or more if needed for any specific MOSFET type. The purpose of the voltage source 155 is to ensure that the gate of transistor 130 is more positive than the source of transistor 130 and hence turn on transistor 130 during normal operation. Since resistor 154 has a 1 MΩ resistance, the amount of current supplied to the gate of transistor 130 is very low. Hence, transistor 130 may be turned off easily by shorting the gate voltage of transistor 130 to zero volts by using transistor 150. Resistor 151 with a 200 KΩ resistance provides the gate voltage for transistor 150. As stated above, resistor 151 is coupled to input 110. Hence, normally the voltage supplied to the gate of transistor 150 by input 110 is very small and transistor 150 is turned off. However, when the voltage of the input 110 is above the gate threshold voltage of transistor 150, then transistor 150 is turned on which turns off transistor 130 protecting the current shunt 170.

Therefore, circuit 100 operates to prevent the input signal 110 from being provided to the current shunt 170 if the absolute value of the input signal 110 exceeds either the positive or negative threshold of transistors, 120 and 130. The first and second detection circuits, 180 and 190, deactivate transistors 120 and 130 respectively when the input voltage 110 exceeds a negative or a positive threshold voltage. Thus, transistors 120 and 130 are configured to function as a fuse. It is further noted that there may be other embodiments for the first and second detection circuits 180 and 190. It is further noted that transistors 120 and 130 may each be comprised of a plurality of transistors, such as MOSFETs, in parallel to increase the current carrying capacity and hence power handling capacity of circuit 100. Transistors 120 and 130 would then be configured to function as an automatically resettable fuse suitable for power distribution systems. That is, circuit 100 would be configured to automatically recover when the overload condition is removed.

Figure 2:
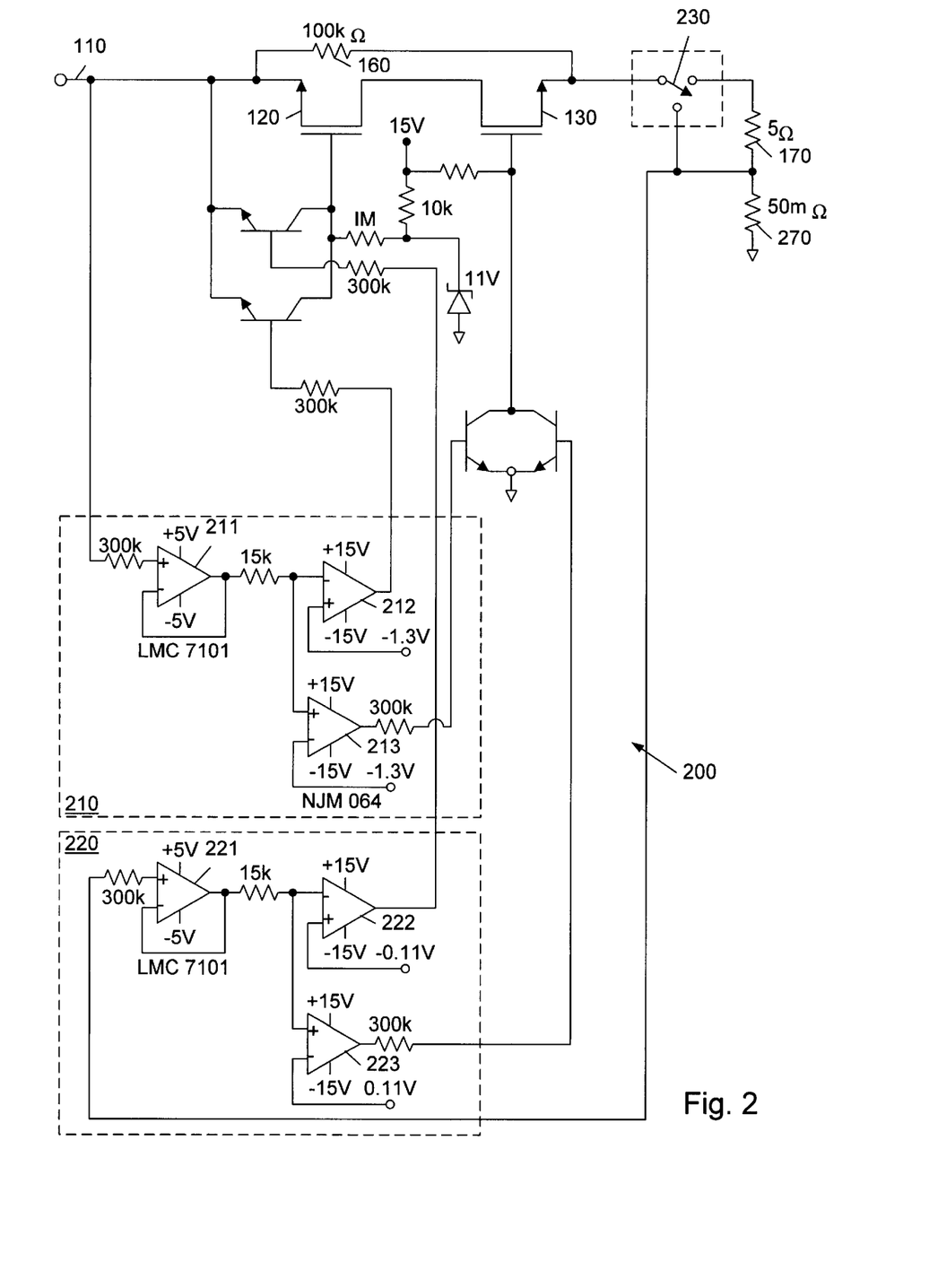
FIG. 2 illustrates another embodiment of the input protection device.

FIG. 2—Input Protection Circuit with a Plurality of Current Shunts

FIG. 2 illustrates an input protection circuit 200 according to an embodiment of the present invention. It is noted that the values of the circuitry elements such as resistors, voltage sources and current shunts, may exhibit different values than the values illustrated in FIG. 2.

FIG. 2 illustrates an input protection circuit 200 with a plurality of current shunts 170 and 270. Current shunt 170 has a much higher resistance value than current shunt 270. Only one of the plurality of current shunts 170 and 270 is connected to circuit 200 at one particular time. A plurality of current shunts 170 and 270 with varying resistance values is implemented so as to provide multiple ranges of measurement. The current through the current shunts, 170 and 270, is measured by reading the voltage drop across the current shunts, 170 and 270. For example, current up to 200 milliamps may flow through current shunt 170 with a 5Ω resistance and hence measure a voltage drop of 1 volt which is measured on a 1 volt range. Current up to 2 amps may flow through current shunt 270 with a 0.05Ω resistance and hence measure a voltage drop of 0.1 volts which is measured on a 0.1 volt range. Therefore, circuit 200 may provide more ranges of measurement than circuit 100.

Circuit 200 comprises an input 110 coupled to a first transistor 120. The first transistor 120 is further coupled to a second transistor 130. The input 110 is further coupled to a resistor 160. The input to switch 230 is coupled to second transistor 130. Switch 230 selectively connects the second transistor 130 to either the first current 170 or the second current shunt 270. The switch 230 thus selects one of the plurality of current shunts 170 and 270. Transistors 120 and 130 may be a MOSFET enhancement type transistor or a bipolar transistor. Transistors 120 and 130 are configured to function in a similar manner to a fuse to protect the current shunts 170 and 270. Circuit 200 further comprises a voltage limiter 210 and a current limiter 220.

Voltage limiter 210 is coupled to transistors, 120 and 130, and to input 110. The voltage limiter 210 operates to selectively deactivate one of transistors, 120 and 130, if the input signal 110 exceeds a first range. Current limiter 220 is coupled to transistors, 120 and 130, and to input 110. The current limiter 220 operates to selectively reduce the gate to source voltages on appropriate transistors, such as transistors 120 and 130, so as to limit the amount of current flowing through current shunt 270, if the input signal 110 exceeds a second range, where the second range is smaller than the first range.

Voltage limiter 210 comprises a first sensing portion that is independent of which current shunt is connected. The first sensing portion may comprise a unity gain amplifier 211 whose output may be coupled through a resistor to a negative input terminal of amplifier 212 and to a positive input terminal of amplifier 213. As illustrated in FIG. 2, amplifier 212 deactivates transistor 120, which is an N-channel MOSFET, when the input voltage 110 exceeds a negative threshold. It is noted that transistor 120 may be other types of transistors such as a P-channel MOSFET. It is further noted that the first sensing portion may be designed to turn off transistor 120 when the input voltage 110 exceeds a positive voltage threshold instead of exceeding a negative voltage threshold. In FIG. 2, the negative threshold voltage is −1.3 volts. It is noted that any particular negative threshold voltage may be used. Amplifier 213 deactivates transistor 130, which is an N-channel MOSFET, when the input voltage 110 exceeds a positive threshold. It is noted that transistor 130 may be other types of transistors such as a P-channel MOSFET. It is further noted that the first sensing portion may be designed to turn off transistor 130 when the input voltage 110 exceeds a negative voltage threshold instead of exceeding a positive voltage threshold. In FIG. 2, the positive threshold voltage is +1.3 volts. It is noted that any particular positive threshold voltage may be used. Typically the threshold voltages are a certain percentage higher than the range to be measured. For example, 1.3 volts was chosen because it is thirty percent higher than the 1 volt measurement range across current shunt 170. It is noted that amplifiers 212 and 213 may deactivate transistors 120 and 130 respectively any number of ways.

Current limiter 220 comprises a second sensing portion that is implemented when the second current shunt 270 is connected to circuit 200. Current limiter 220 is needed to protect the second current shunt 270 because of the small resistance value exhibited by the second current shunt 270. As stated above, voltage limiter 210 limits the voltage across current shunt 170 to 1.3 volts which is about 30% higher than its full measurement range. By limiting the voltage across current shunt 170 to 1.3 volts, voltage limiter 210 limits the power dissipated by current shunt 170, with a value of 5Ω, to about a third of a watt. However, 1.3 volts across current shunt 270, with a value of 0.05Ω, would cause current shunt 270 to dissipate 34 watts. Current shunt 270 would consequently be damaged such as changing the shunt value which would cause a loss of accuracy. Hence the voltage across current shunt 270 should be limited to 0.13 volts so that current shunt 270 dissipates about a third of a watt. One solution is to provide two different threshold values so that the voltage is limited to 1.3 volts when using current shunt 170 and limited to 0.13 volts when using current shunt 270. However, a disadvantage to the solution is that it requires switching circuits to change modes of the circuit and may not always function reliably under power-fail conditions. Therefore, a current limiter 220 comprising a second sensing portion may be needed to sense current across current shunt 270 to form a current limiter at about 2.6 to 3 amps. That is, current limiter 200 ensures that not more than 2.6 to 3 amps will flow through current shunt 270 and thereby ensures that the voltage across current shunt 270 will not exceed 0.13 volts.

Current limiter 220 limits the current flowing through the first transistor 120 and through the second transistor 130. The second sensing portion comprises a unity gain amplifier 221 whose output may coupled to a negative input terminal of amplifier 222 and to a positive input terminal of amplifier 223. As illustrated in FIG. 2, amplifier 222 limits the current flowing through transistor 120, which is an N-channel MOSFET, when the input voltage 110 exceeds a negative threshold. It is noted that transistor 120 may be other types of transistors such as a P-channel MOSFET. It is further noted that the second sensing portion may be designed to limit current through transistor 120 when the input voltage 110 exceeds a positive voltage threshold instead of exceeding a negative voltage threshold. In FIG. 2, the negative threshold voltage is −0.11 volts. It is noted that any particular negative threshold voltage may be used. Amplifier 223 limits the current flowing through transistor 130, which is an N-channel MOSFET, when the input voltage 110 exceeds a positive threshold. It is noted that transistor 130 may be other types of transistors such as a P-channel MOSFET. It is further noted that the second sensing portion may be designed to limit the current flowing through transistor 130 when the input voltage 110 exceeds a negative voltage threshold instead of a positive voltage threshold. In FIG. 2, the positive threshold voltage is +0.11 volts. It is noted that any particular positive threshold voltage may be used. It is further noted that amplifiers 222 and 223 may limit the current flowing through transistors 120 and 130 respectively any number of ways.

As stated above, the voltage limiter 210 protects current limiter 220 when the voltage exceeds the first range. In FIG. 2, the first range was from −1.3 volts to +1.3 volts. The current limiter 220 protects the current shunts, 170 and 270, up to a second range. In FIG. 2, the second range was from −0.11 volts to +0.11 volts. The current limiter needs to be protected above the second range or else the current limiter 220 and circuit 200 will be overheated.

It is noted that transistors 120 and 130 may each be comprised of a plurality of transistors, such as MOSFETs, in parallel to increase the current carrying capacity and hence power handling capacity of circuit 200. Transistors 120 and 130 would then be configured to function as an automatically resettable fuse suitable for power distribution systems. That is, circuit 200 would be configured to automatically recover when the overload condition is removed.

Figure 3:
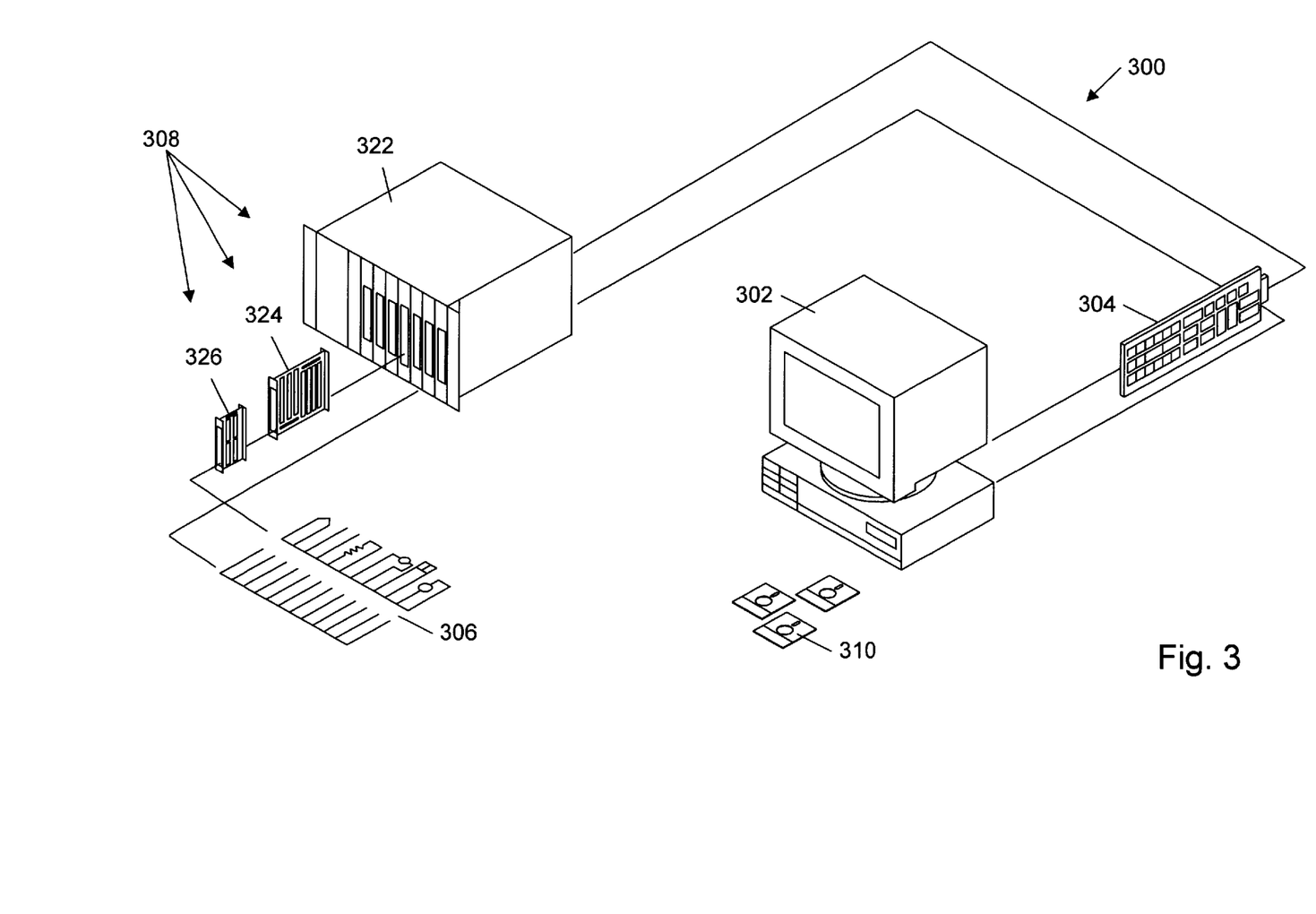
FIG. 3 illustrates an instrumentation system which may includes embodiments of the input protection device of FIGS. 1 and/or 2.

FIG. 3—Instrumentation System

FIG. 3 illustrates a computer-based instrumentation system 300, which may implement the input protection circuit of the present invention. However, the input protection circuit of the present invention may be comprised in any of various systems, such as a standard handheld or benchtop instrument, e.g., a standard multimeter, or in any of various other systems which use an input protection device. Examples of systems where the input protection circuit may be used include instrumentation systems, industrial automation systems, audio systems, telephony systems, video systems, and other systems where input signal protections is desired. Thus FIG. 3 is an example of one embodiment, and the present invention may be used in any of various systems.

The instrumentation system 300 comprises a computer 302 having an operating system and other software, an instrumentation device or board 304 coupled to or comprised in the computer 302, and transducers 306 or other detecting means which provide field electrical signals to/from the instrumentation device 304 through signal conditioning logic 308.

The computer 302 includes various standard components, including at least one central processing unit (CPU), memory, a non-volatile memory, one or more buses, and a power supply. The computer also stores software programs, represented by medium 310. In one embodiment, the computer 302 comprises input/output (I/O) slots into which the instrumentation device 304 is coupled.

The transducers 306 and other detecting means provide the field signals representing a process, physical phenomena, equipment being monitored or measured, etc. to/from the instrumentation device 304. Examples of the transducers 306 are strain gauges, thermocouples, thermistors, photoconductive cells, microphones, and piezoelectric transducers, among others. The transducers 306 may provide a signal with voltage spikes or other undesirable properties where input protection is desired.

The transducers 306 are optionally conditioned by the signal conditioning system 308 for presentation to the device 304 as shown. In the embodiment of FIG. 3, the signal conditioning circuitry 308 comprises an SCXI (Signal Conditioning Extensions for Instrumentation) chassis 322, one or more SCXI modules 324, and one or more SCXI terminal blocks 326. SCXI is an open architecture, multi-channel signal conditioning front-end system for instrumentation devices. SCXI comprises an external chassis housing signal conditioning modules for amplifying, multiplexing, and isolating field signals. The signal conditioning modules advantageously reduce the introduction of noise into the signals transmitted to the device 304.

In the embodiment of FIG. 3, the instrumentation device 304 is a board or card adapted for insertion into an expansion slot of the computer system 302. The board 304 is shown external to the computer system 302 in FIG. 3 for illustrative purposes. In another embodiment, the instrumentation device 304 is external to the computer 302. For example, the device 304 may be coupled to the computer 302 by a VXI (VME Extensions for Instrumentation) chassis and bus, a GPIB (General Purpose Interface Bus), a serial bus or port, e.g., USB or IEEE 1394, a parallel port, or other type of bus or cabling. The instrumentation device 304 may be any of various types, such as a data acquisition (DAQ) device or card, a multimeter card, a voltmeter card, etc. In the embodiment of FIG. 3, the instrument device 304 comprises the input protection device of the present invention.

In one embodiment, the signal conditioning system 308 includes the input protection circuit of the present invention. In an alternate embodiment, the input protection circuit of the present invention is comprised on the device 304.

Although the system and method of the present invention is described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims.

What is claimed is:

1. An input protection circuit, comprising:
   an input for receiving an input signal;
   a first transistor coupled to the input;
   a second transistor coupled in series to the first transistor;
   a first detection circuitry coupled to the first transistor, wherein the first detection circuitry is operable to:
      detect a level of the input signal;
      deactivate the first transistor if the level of the input signal exceeds a first voltage threshold;
   a second detection circuitry coupled to the second transistor, wherein the second detection circuitry is operable to:
      detect the level of the input signal;
      deactivate the second transistor if the level of the input signal exceeds a second voltage threshold; and
   a current shunt coupled to the second transistor;
   wherein the input protection circuit operates to prevent the input signal from being provided to the current shunt if the level of the input signal exceeds either the first or second voltage threshold;
   wherein the first detection circuit and the second detection circuit are each operable to be powered using an enhancement voltage source.

2. The input protection circuit as recited in claim 1, wherein the input protection circuit further comprises:
   a resistor coupled to the input and to the current shunt, wherein the resistor operates to discharge any capacitive charge.

3. The input protection circuit as recited in claim 1, wherein the first detection circuitry comprises a third transistor; and
   wherein when the level of the input signal exceeds either the first or second voltage threshold, then the third transistor is activated, which operates to deactivate the first transistor.

4. The input protection circuit as recited in claim 3,
   wherein a collector of the third transistor is coupled to a gate of the first transistor;
   wherein an emitter of the third transistor is coupled to a source of the first transistor; and
   wherein when the level of the input signal exceeds either the first or second voltage threshold, then a source voltage of the first transistor equals a gate voltage of the first transistor, thereby deactivating the first transistor.

5. The input protection circuit as recited in claim 4, wherein the first detection circuitry further comprises:
   a first voltage source coupled through a first resistor to the collector of the third transistor;
   a second voltage source coupled through a second resistor to a base of the third transistor; and
   a first diode coupled to the gate and to the source of the first transistor;
   wherein the first diode protects the gate of the first transistor from excess voltage damage;
   wherein the first voltage source provides enhancement voltage to the gate of the first transistor which turns on the first transistor during normal operations;
   wherein the second voltage source determines the value of the voltage threshold.

6. The input protection circuit as recited in claim 1, wherein the second detection circuitry comprises a fourth transistor; and
   wherein when the level of the input signal exceeds either the first or second voltage threshold, then the fourth transistor is activated, which operates to deactivate the second transistor.

7. The input protection circuit as recited in claim 6, wherein a source of the fourth transistor is coupled to a gate of the second transistor; wherein a gate of the fourth transistor is coupled in parallel to a plurality of zener diodes;
   wherein the second detection circuitry further comprises:
      a first voltage source coupled through a first resistor to the drain of the fourth transistor; and
      a second resistor coupled between the input and the gate of the fourth transistor;
   wherein a source of the fourth transistor is coupled to ground;
   wherein the plurality of zener diodes operates to provide clamping to prevent excess voltage at the gate of the fourth transistor;
   wherein the first voltage source provides enhancement voltage to the gate of the second transistor which turns on the second transistor during normal operations;
   wherein when the input is above the gate threshold voltage of the fourth transistor, then the fourth transistor is turned on which turns off the second transistor.

8. The input protection circuit as recited in claim 1, wherein the first and second transistors are MOSFET enhancement type transistors.

9. The input protection circuit as recited in claim 1, wherein the first and second transistors are bipolar transistors.

10. The input protection circuit as recited in claim 1, wherein the first and second transistors are each comprised of a plurality of transistors in parallel, wherein the first and second transistors are configured to function as an automatically resettable fuse.

11. The input protection circuit as recited in claim 10, wherein the plurality of transistors in parallel of the first and second transistor are MOSFET enhancement type transistors.

12. An input protection circuit providing protection for a first current shunt and a second current shunt, wherein the second current shunt is less in resistance than the first current shunt, the input protection circuit comprising:
   an input for receiving an input signal;
   a first transistor coupled to the input;
   a second transistor coupled in series to the first transistor;
   a switch including an input coupled to the second transistor, wherein the switch selectively connects the second transistor to either the first current shunt or the second current shunt;
   a first voltage limiter coupled to the first and the second transistor and to the input, wherein the first voltage limiter operates to selectively deactivate one of the first transistor or the second transistor if the input signal exceeds a first range;
   a second voltage limiter coupled to the first and the second transistor and to the first and the second current shunt, wherein the second voltage limiter operates to selectively deactivate one of the first transistor or the second transistor if the input signal exceeds a second range;
   wherein the second range is smaller than the first range.

13. An input protection circuit providing protection for a first current shunt and a second current shunt, wherein the second current shunt is less in resistance than the first current shunt, the input protection circuit comprising:

an input for receiving an input signal;

a first transistor coupled to the input;

a second transistor coupled in series to the first transistor;

a switch including an input coupled to the second transistor, wherein the switch selectively connects the second transistor to either the first current shunt or the second current shunt;

a voltage limiter coupled to the first and the second transistor and to the input, wherein the voltage limiter operates to selectively deactivate one of the first transistor or the second transistor if the input signal exceeds a first range;

a current limiter coupled to the first and the second transistor and to the first and the second current shunt, wherein the current limiter operates to selectively deactivate one of the first transistor or the second transistor if the input signal exceeds a second range;

wherein the second range is smaller than the first range.

14. The circuit as recited in claim 13, wherein the current limiter limits the current flowing through the first and second transistor when the input exceeds the second range.

15. The circuit as recited in claim 14, wherein the voltage limiter limits the voltage of the first and second transistor when the input exceeds the first range.

16. The circuit as recited in claim 15, wherein the voltage limiter comprises a first sensing portion that is independent of which current shunt is connected, wherein the first sensing portion comprises a first amplifier in a unity gain configuration coupled to a second and third amplifier, wherein the second amplifier has a negative threshold voltage of the first range and the third amplifier has a positive threshold voltage of the first range, wherein when input exceeds the negative threshold voltage of the second amplifier, the second amplifier is configured to deactivate the first transistor, wherein when input exceeds the positive threshold voltage of the third amplifier, the third amplifier is configured to deactivate the second transistor.

17. The circuit as recited in claim 16, wherein the current limiter comprises a second sensing portion that is implemented when the second current shunt is connected to the circuit, wherein the second sensing portion comprises a fourth amplifier in a unity gain configuration coupled to a fifth and a sixth amplifier, wherein the fifth amplifier has a negative threshold voltage of the second range and the sixth amplifier has a positive threshold voltage of the second range, wherein when input exceeds the negative threshold voltage of the fifth amplifier, the fifth amplifier is configured to limit the current flowing through the first transistor, wherein when input exceeds the positive threshold voltage of the sixth amplifier, the sixth amplifier is configured to limit the current flowing through the second transistor.

18. The circuit as recited in claim 13, wherein the first and second transistors are MOSFET enhancement type transistors.

19. The circuit as recited in claim 13, wherein the first and second transistors are bipolar transistors.

20. The circuit as recited in claim 13, wherein the circuit resides in a measurement device, wherein the measurement device resides in a computer system.

21. The circuit as recited in claim 13, wherein the first and second transistors are each comprised of a plurality of transistors in parallel, wherein the first and second transistors are configured to function as an automatically resettable fuse.

22. The circuit as recited in claim 21, wherein the plurality of transistors in parallel of the first and second transistor are MOSFET enhancement type transistors.

23. An input protection circuit providing protection for a measurement circuit comprising:

an input for receiving an input signal;

a first transistor coupled to the input;

a second transistor coupled in series to the first transistor;

a voltage limiter coupled to the first and the second transistor and to the input, wherein the voltage limiter operates to selectively deactivate one of the first transistor or the second transistor if the input signal exceeds a first range;

a current limiter coupled to the first and the second transistor and to the first and the second current shunt, wherein the current limiter operates to selectively deactivate one of the first transistor or the second transistor if the input signal exceeds a second range;

wherein the second range is smaller than the first range.

24. The circuit as recited in claim 23, wherein the current limiter limits the current flowing through the first and second transistor when the input exceeds the second range.

25. The circuit as recited in claim 24, wherein the voltage limiter limits the voltage of the first and second transistor when the input exceeds the first range.

26. The circuit as recited in claim 25, wherein the voltage limiter comprises a first sensing portion, wherein the first sensing portion comprises a first amplifier in a unity gain configuration coupled to a second and third amplifier, wherein the second amplifier has a negative threshold voltage of the first range and the third amplifier has a positive threshold voltage of the first range, wherein when input exceeds the negative threshold voltage of the second amplifier, the second amplifier is configured to deactivate the first transistor, wherein when input exceeds the positive threshold voltage of the third amplifier, the third amplifier is configured to deactivate the second transistor.

27. The circuit as recited in claim 26, wherein the current limiter comprises a second sensing portion, wherein the second sensing portion comprises a fourth amplifier in a unity gain configuration coupled to a fifth and a sixth amplifier, wherein the fifth amplifier has a negative threshold voltage of the second range and the sixth amplifier has a positive threshold voltage of the second range, wherein when input exceeds the negative threshold voltage of the fifth amplifier, the fifth amplifier is configured to limit the current flowing through the first transistor, wherein when input exceeds the positive threshold voltage of the sixth amplifier, the sixth amplifier is configured to limit the current flowing through the second transistor.

28. The circuit as recited in claim 23, wherein the first and second transistors are MOSFET enhancement type transistors.

29. The circuit as recited in claim 23, wherein the first and second transistors are bipolar transistors.

30. The circuit as recited in claim 23, wherein the circuit resides in a measurement device, wherein the measurement device resides in a computer system.

31. The circuit as recited in claim 23, wherein the first and second transistors are each comprised of a plurality of transistors in parallel, wherein the first and second transistors are configured to function as an automatically resettable fuse.

32. The circuit as recited in claim 31, wherein the plurality of transistors in parallel of the first and second transistor are MOSFET enhancement type transistors.

33. The input protection circuit as recited in claim 1,
wherein the enhancement voltage source is operable to generate an enhancement voltage to at least one of the first detection circuit and the second detection circuit, wherein the enhancement voltage is separate from the input signal.

34. The input protection circuit as recited in claim 1,
wherein the enhancement voltage source for the first detection circuit is separate from the enhancement voltage source for the second detection circuit.

35. The input protection circuit as recited in claim 1,
wherein the first voltage threshold comprises one of a positive or negative voltage threshold.

36. The input protection circuit as recited in claim 35,
wherein the second voltage threshold comprises the other of the positive or negative voltage threshold.

* * * * *